US012785648B2

(12) United States Patent
Nagatomo

(10) Patent No.: US 12,785,648 B2
(45) Date of Patent: Nov. 3, 2026

(54) ACOUSTIC WAVE DEVICE WITH INTERDIGITAL TRANSDUCER ELECTRODES ON BOTH SURFACES OF A PIEZOELECTRIC FILM

(71) Applicant: Murata Manufacturing Co., Ltd., Nagaokakyo (JP)

(72) Inventor: Sho Nagatomo, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 565 days.

(21) Appl. No.: 18/381,673

(22) Filed: Oct. 19, 2023

(65) Prior Publication Data

US 2024/0048118 A1 Feb. 8, 2024

Related U.S. Application Data

(63) Continuation of application No. PCT/JP2022/024129, filed on Jun. 16, 2022.

(30) Foreign Application Priority Data

Jun. 22, 2021 (JP) ................................ 2021-103195

(51) Int. Cl.
*H03H 9/02* (2006.01)
*H03H 9/145* (2006.01)

(52) U.S. Cl.
CPC .... *H03H 9/02228* (2013.01); *H03H 9/02559* (2013.01); *H03H 9/02574* (2013.01); *H03H 9/14541* (2013.01)

(58) Field of Classification Search
CPC ........... H03H 9/02228; H03H 9/02559; H03H 9/02574; H03H 9/14541; H03H 9/02015; H03H 9/173; H03H 9/175; H03H 9/25
See application file for complete search history.

(56) References Cited

U.S. PATENT DOCUMENTS 10,924,086 B2 * 2/2021 Solal ................. H03H 9/02669
2007/0267942 A1 11/2007 Matsumoto et al.
(Continued)

FOREIGN PATENT DOCUMENTS

JP 2007312164 A 11/2007
JP 2013143608 A 7/2013
(Continued)

OTHER PUBLICATIONS

International Search Report in PCT/JP2022/024129, mailed Aug. 23, 2022, 3 pages.
(Continued)

*Primary Examiner* — Emily P Pham
(74) *Attorney, Agent, or Firm* — Keating & Bennett, LLP

(57) ABSTRACT

An acoustic wave device includes a piezoelectric film on an energy confinement layer, an IDT electrode and a first dielectric film on a first main surface of the piezoelectric film, a second IDT electrode and a second dielectric film on the second main surface. When a product of a density and a film thickness of the second dielectric film on a side of the second main surface is larger than that of the first dielectric film on the first main surface side, a total sum of a product of a density and a film thickness of an electrode finger of the first IDT electrode covered with the first dielectric film is smaller than a total sum of a product of a density and a film thickness of an electrode finger of the second IDT electrode.

24 Claims, 9 Drawing Sheets

(56) References Cited

U.S. PATENT DOCUMENTS

| | | | |
|---|---|---|---|
| 2008/0106354 A1 | 5/2008 | Kando | |
| 2015/0102705 A1 | 4/2015 | Iwamoto et al. | |
| 2016/0182007 A1 | 6/2016 | Bhattacharjee | |
| 2019/0044498 A1 | 2/2019 | Kawasaki | |

FOREIGN PATENT DOCUMENTS

| | | | |
|---|---|---|---|
| JP | 5835480 | B2 | 12/2015 |
| JP | 2018506930 | A | 3/2018 |
| WO | 2007007462 | A1 | 1/2007 |
| WO | 2017187768 | A1 | 11/2017 |

OTHER PUBLICATIONS

Written Opinion in PCT/JP2022/024129, mailed Aug. 23, 2022, 3 pages.

* cited by examiner

ACOUSTIC WAVE DEVICE WITH INTERDIGITAL TRANSDUCER ELECTRODES ON BOTH SURFACES OF A PIEZOELECTRIC FILM

CROSS REFERENCE TO RELATED APPLICATIONS

This application claims the benefit of priority to Japanese Patent Application No. 2021-103195 filed on Jun. 22, 2021 and is a Continuation Application of PCT Application No. PCT/JP2022/024129 filed on Jun. 16, 2022. The entire contents of each application are hereby incorporated herein by reference.

BACKGROUND OF THE INVENTION

1. Field of the Invention

The present invention relates to an acoustic wave device in which interdigital transducer (IDT) electrodes are provided on both surfaces of a piezoelectric film.

2. Description of the Related Art

In the related art, an acoustic wave device in which IDT electrodes are provided on both surfaces of a piezoelectric film is known. For example, in an acoustic wave device described in Japanese Unexamined Patent Application Publication No. 2018-506930, a waveguide confinement structure including a fast wave propagation layer, a slow wave propagation layer, and a piezoelectric film are laminated in this order on a support substrate. Further, the slow wave propagation layer and the waveguide confinement structure are laminated on the piezoelectric film. The high acoustic velocity member is made of a high acoustic velocity material in which the acoustic velocity of a sound wave is higher than the acoustic velocity of a sound wave propagating through the piezoelectric film. In addition, a first IDT electrode and a second IDT electrode are provided to face each other with the piezoelectric film interposed therebetween. However, it is said that the slow wave propagation layer and the waveguide confinement structure laminated on the piezoelectric film may be omitted.

SUMMARY OF THE INVENTION

In the related acoustic wave device as described in Japanese Unexamined Patent Application Publication No. 2018-506930, spurious due to a higher-order mode may be generated.

Preferred embodiments of the present invention provide acoustic wave devices in each of which a higher-order mode is less likely to occur.

According to a first preferred embodiment of the present invention, an acoustic wave device includes a piezoelectric film that includes a first main surface and a second main surface that face each other, an interdigital transducer (IDT) electrode in contact with the piezoelectric film and including a first IDT electrode on the first main surface of the piezoelectric film and a second IDT electrode on the second main surface of the piezoelectric film, an energy confinement layer on a side of the second main surface of the piezoelectric film to confine energy of an acoustic wave propagating through the piezoelectric film in the piezoelectric film, and first and second dielectric films covering the first and second IDT electrodes, respectively, on the first main surface and the second main surface of the piezoelectric film, or the first or second dielectric films covering the first IDT electrode or the second IDT electrode on one of the first main surface and the second main surface, the first and second dielectric films being not provided on the other of the first main surface and the second main surface, wherein the first and second dielectric films have a bulk wave acoustic velocity lower than an acoustic velocity of the acoustic wave propagating through the piezoelectric film or a bulk wave acoustic velocity higher than the acoustic velocity of the acoustic wave propagating through the piezoelectric film, or the first dielectric film has a bulk wave acoustic velocity lower than the acoustic velocity of the acoustic wave propagating through the piezoelectric film and the second dielectric film has a bulk wave acoustic velocity higher than the acoustic velocity of the acoustic wave propagating through the piezoelectric film, and a total sum of a product of a density and a film thickness of an electrode finger of the IDT electrode that is covered with a dielectric film having a smaller product of a density and a film thickness, in the first dielectric film and the second dielectric film or is not covered with any of the first and second dielectric films is smaller than a total sum of a product of a density and a film thickness of an electrode finger of the IDT electrode that is covered with a dielectric film having a larger product of the density and the film thickness, in the first dielectric film and the second dielectric film or is provided on a main surface on a side opposite to the IDT electrode not covered with any of the first and second dielectric films.

According to a second preferred embodiment of the present invention, an acoustic wave device includes a piezoelectric film that includes a first main surface and a second main surface that face each other, an interdigital transducer (IDT) electrode in contact with the piezoelectric film and including a first IDT electrode on the first main surface of the piezoelectric film and a second IDT electrode on the second main surface of the piezoelectric film, an energy confinement layer on a side of the second main surface of the piezoelectric film to confine energy of an acoustic wave propagating through the piezoelectric film in the piezoelectric film, and first and second dielectric films covering the first and second IDT electrodes, respectively, on the first main surface and the second main surface of the piezoelectric film, or the first or second dielectric film covering the first IDT electrode or the second IDT electrode on one of the first main surface and the second main surface, the first and second dielectric films being not provided on the other of the first main surface and the second main surface, wherein the first dielectric film has a bulk wave acoustic velocity higher than an acoustic velocity of an acoustic wave propagating through the piezoelectric film and the second dielectric film has a bulk wave acoustic velocity lower than the acoustic velocity of the acoustic wave propagating through the piezoelectric film, and a total sum of a product of a density and a film thickness of an electrode finger of the IDT electrode covered with a dielectric film having a smaller product of a density and a film thickness, in the first dielectric film and the second dielectric film or is not covered with any of the first and second dielectric films is larger than a total sum of a product of a density and a film thickness of an electrode finger of the IDT electrode that is covered with a dielectric film having a larger product of the density and the film thickness, in the first dielectric film and the second dielectric film or is provided on a main surface on a side opposite to the IDT electrode not covered with any of the first and second dielectric films.

According to a third preferred embodiment of the present invention, an acoustic wave device includes a piezoelectric film including a first main surface and a second main surface that face each other, an interdigital transducer (IDT) electrode in contact with the piezoelectric film and including a first IDT electrode on the first main surface of the piezoelectric film and a second IDT electrode on the second main surface of the piezoelectric film, a support substrate on a side of the second main surface of the piezoelectric film and including a cavity, and first and second dielectric films covering the first and second IDT electrodes, respectively, on the first main surface and the second main surface of the piezoelectric film, or the first or second dielectric film covering the first IDT electrode or the second IDT electrode on one of the first main surface and the second main surface, the first and second dielectric films being not provided on the other of the first main surface and the second main surface, wherein the first and second dielectric films have a bulk wave acoustic velocity lower than an acoustic velocity of an acoustic wave propagating through the piezoelectric film or have a bulk wave acoustic velocity higher than the acoustic velocity of the acoustic wave propagating through the piezoelectric film, or the first dielectric film has the bulk wave acoustic velocity lower than the acoustic velocity of the acoustic wave propagating through the piezoelectric film and the second dielectric film has a bulk wave acoustic velocity higher than the acoustic velocity of the acoustic wave propagating through the piezoelectric film, and a total sum of a product of a density and a film thickness of an electrode finger of the IDT electrode that is covered with a dielectric film having a smaller product of a density and a film thickness, in the first dielectric film and the second dielectric film or is not covered with any of the first and second dielectric films is smaller than a total sum of a product of a density and a film thickness of an electrode finger of the IDT electrode that is covered with a dielectric film having a larger product of the density and the film thickness, in the first dielectric film and the second dielectric film or is provided on a main surface on a side opposite to the IDT electrode not covered with any of the first and second dielectric films.

According to a fourth preferred embodiment of the present invention, an acoustic wave device includes a piezoelectric film that includes a first main surface and a second main surface that face each other, an interdigital transducer (IDT) electrode in contact with the piezoelectric film and including a first IDT electrode on the first main surface of the piezoelectric film and a second IDT electrode on the second main surface of the piezoelectric film, a support substrate on a side of the second main surface of the piezoelectric film and including a cavity, and first and second dielectric films covering the first and second IDT electrodes, respectively, on the first main surface and the second main surface of the piezoelectric film, or the first or second dielectric film covering the first IDT electrode or the second IDT electrode on one of the first main surface and the second main surface, the first and second dielectric films being not provided on the other of the first main surface and the second main surface, wherein the first dielectric film has a bulk wave acoustic velocity higher than an acoustic velocity of an acoustic wave propagating through the piezoelectric film and the second dielectric film has a bulk wave acoustic velocity lower than the acoustic velocity of the acoustic wave propagating through the piezoelectric film, and a total sum of a product of a density and a film thickness of an electrode finger of the IDT electrode that is covered with a dielectric film having a smaller product of a density and a film thickness, in the first dielectric film and the second dielectric film or is not covered with any of the first and second dielectric films is larger than a total sum of a product of a density and a film thickness of an electrode finger of the IDT electrode that is covered with a dielectric film having a larger product of the density and the film thickness, in the first dielectric film and the second dielectric film or provided on a main surface on a side opposite to the IDT electrode not covered with any of the first and second dielectric films.

According to preferred embodiments of the present invention, it is possible to provide acoustic wave devices in each of which a higher-order mode is less likely to occur.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be elucidated by describing specific preferred embodiments of the present invention with reference to the accompanying drawings.

It should be pointed out that each preferred embodiment described in the present specification is an example, and partial replacement or combination of configurations is possible between different preferred embodiments.

Figure 1A:
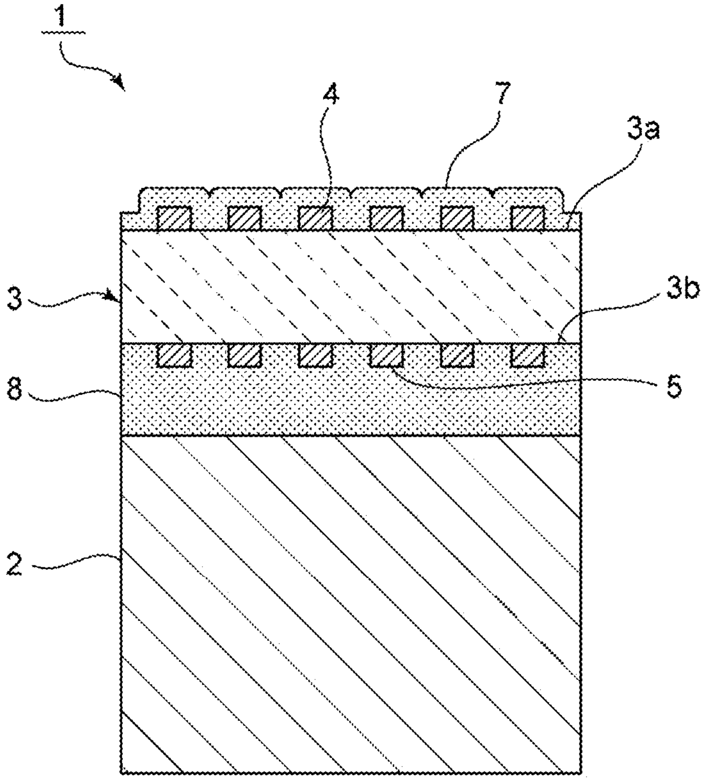
FIGS. 1A and 1B are a front sectional view and a schematic plan view illustrating an electrode structure of an acoustic wave device according to a first preferred embodiment of the present invention.
Figure 1B:
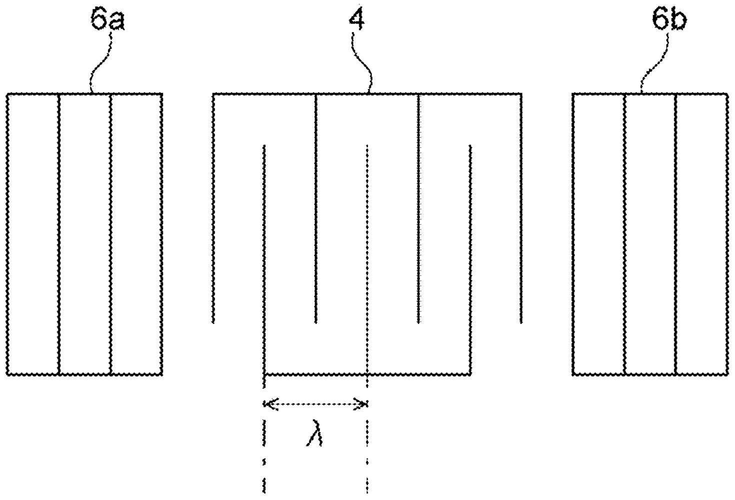

FIGS. 1A and 1B are a front sectional view and a schematic plan view illustrating an electrode structure of an acoustic wave device according to a first preferred embodiment.

An acoustic wave device 1 includes a piezoelectric film 3. The piezoelectric film 3 is not particularly limited, but in the present preferred embodiment, the piezoelectric film 3 is made of a 42° Y-cut X-propagation lithium tantalate film, for example. The piezoelectric film 3 includes a first main surface 3*a* and a second main surface 3*b* that face each other. A first interdigital transducer (IDT) electrode 4 is provided on the first main surface 3*a* of the piezoelectric film 3. Actually, as illustrated in FIG. 1B, reflectors 6*a* and 6*b* are provided on both sides of the first IDT electrode 4 in an acoustic wave propagation direction.

A second IDT electrode 5 is also provided on the second main surface 3*b* of the piezoelectric film 3. Reflectors are also provided on both sides of the second IDT electrode 5 in an acoustic wave propagation direction. Therefore, an acoustic wave resonator is configured. The acoustic wave device 1 is an acoustic wave resonator.

An electrode finger of the first IDT electrode 4 and an electrode finger of the second IDT electrode 5 face each other with the piezoelectric film 3 interposed therebetween. The electrode finger of the first IDT electrode and the electrode finger of the second IDT electrode may be in an in-phase relationship or may be in an anti-phase relationship.

A first dielectric film 7 is provided on the first main surface 3*a* of the piezoelectric film 3 to cover the first IDT electrode 4. A second dielectric film 8 is provided to cover the second IDT electrode 5 also on the second main surface 3*b*. The piezoelectric film 3 is laminated on the support substrate 2 with the second dielectric film 8 interposed therebetween. In other words, the piezoelectric film 3 is indirectly laminated on the support substrate 2 from the second main surface 3*b* side.

In the acoustic wave device 1, the first and second dielectric films 7 and 8 have a bulk wave acoustic velocity lower than an acoustic velocity of an acoustic wave propagating through the piezoelectric film 3. The support substrate 2 is made of a high acoustic velocity material having a bulk wave acoustic velocity higher than the acoustic velocity of the acoustic wave propagating through the piezoelectric film 3. In other words, the support substrate 2 is a high acoustic velocity structure including a high acoustic velocity material, and defines and functions as an energy confinement layer to confine acoustic wave energy in the piezoelectric film 3.

One of the unique features of the present preferred embodiment is that a total sum of a product of a density and a film thickness of an electrode finger of the IDT electrode covered with a dielectric film having a smaller product of a density and a film thickness, in the first dielectric film 7 and the second dielectric film 8 is smaller than a total sum of a product of a density and a film thickness of an electrode finger of the IDT electrode covered with a dielectric film having a larger product of the density and the film thickness, in the first dielectric film 7 and the second dielectric film 8. In the present preferred embodiment, the product of the density and the film thickness of the first dielectric film 7 is smaller than the product of the density and the film thickness of the second dielectric film 8. Therefore, the total sum of the product of the density and the film thickness of the electrode finger of the first IDT electrode 4 is smaller than the product of the density and the film thickness of the electrode finger of the second IDT electrode 5. As a result, the higher-order mode is suppressed. This will be clarified by describing Example 1 and Comparative Example 1 below.

As Example 1, an acoustic wave device having the following configuration was prepared.

An electrode finger pitch of the first and second IDT electrodes 4 and 5 is set to 1 μm, and a duty thereof is both set to 0.5. A wavelength determined by the electrode finger pitch is defined as λ. λ=2 μm.

First dielectric film 7: $SiO_2$ film, film thickness is 0.03λ

First IDT electrode 4: Al film, film thickness is 0.08λ

Piezoelectric film 3: 42° Y-cut X-axis propagation $LiTaO_3$ film, film thickness is 0.4λ

Second dielectric film 8: $SiO_2$ film, film thickness is 0.2λ

Second IDT electrode 5: Pt film, and the normalized film thickness of the second IDT electrode 5 was changed in various ways.

Support substrate 2: sapphire

The film thicknesses of the first and second dielectric films 7 and 8 refer to thicknesses up to the surfaces of the outer side portions of the first and second dielectric films 7 and 8 from the first and second main surfaces 3*a* and 3*b* of the piezoelectric film 3.

Figure 2:
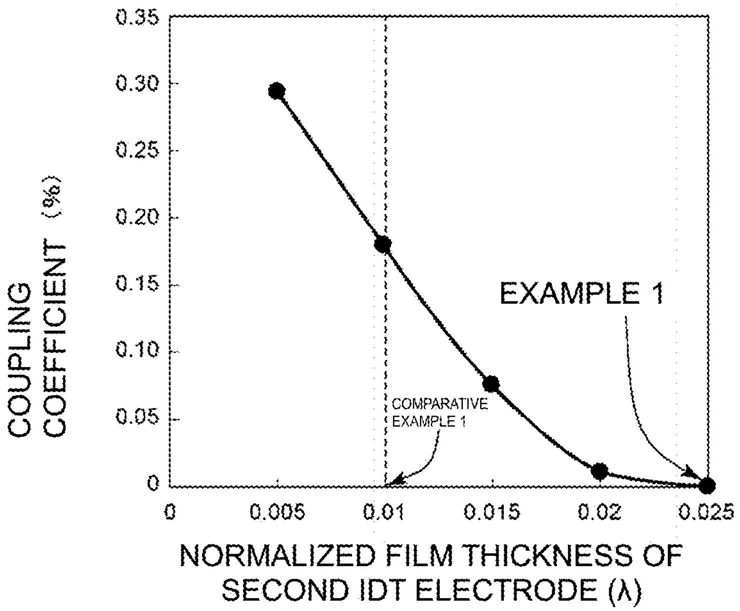
FIG. 2 is a diagram illustrating a relationship between a normalized film thickness of a second interdigital transducer (IDT) electrode and a coupling coefficient of a higher-order mode in the first preferred embodiment of the present invention.

FIG. 2 is a diagram illustrating a relationship between the normalized film thickness of the second IDT electrode 5 and a coupling coefficient of the higher-order mode (SH1 mode) in the acoustic wave device 1. Hereinafter, the normalized film thicknesses are all film thicknesses normalized by the wavelength λ. In FIG. 2, the case where the normalized film thickness of the second IDT electrode 5 is 0.01λ is a case where a mass load by the first IDT electrode 4 and a mass load by the second IDT electrode are equal to each other, and this is Comparative Example 1. Here, the mass load corresponds to the total sum of the products of the densities and the film thicknesses of the electrode fingers of the first and second IDT electrodes 4 and 5.

In FIG. 2, a case where the normalized film thickness of the second IDT electrode 5 is larger than that of Comparative Example 1 is the configuration of the present preferred embodiment. In Example 1, the film thickness of the second IDT electrode 5 was set to 0.025λ. As is apparent from FIG. 2, in Example 1, the normalized film thickness of the second IDT electrode 5 is 0.025λ, and the coupling coefficient of the higher-order mode is approximately 0%. Meanwhile, in Comparative Example 1, the coupling coefficient of the higher-order mode is as large as 0.18%. Therefore, according to Example 1, it can be seen that the higher-order mode is suppressed.

Further, as is apparent from FIG. 2, the normalized film thickness of the second IDT electrode 5 is larger than 0.01λ. Preferably, the normalized film thickness of the second IDT electrode 5 is 0.015λ or more, and at this time, the coupling coefficient of the higher-order mode is 0.08% or less, and more preferably, the normalized film thickness of the second IDT electrode 5 is 0.02λ or more, and at this time, the coupling coefficient of the higher-order mode is 0.01% or less. Further preferably, when the normalized film thickness of the second IDT electrode 5 is 0.025λ as in Example 1, it can be seen that the higher-order mode is not generated substantially.

Figure 5:
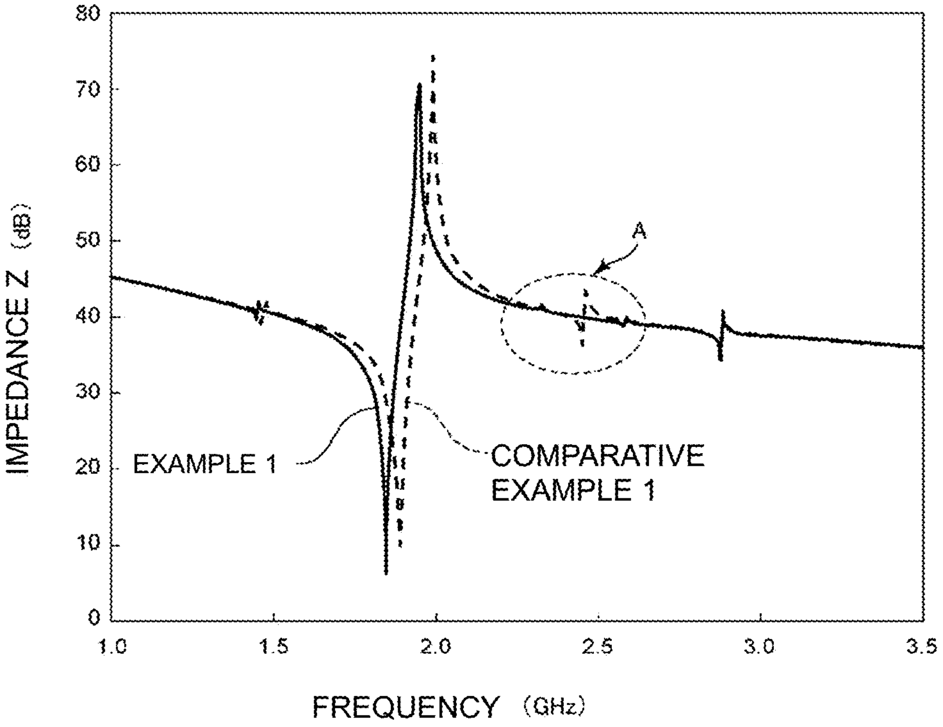
FIG. 5 is a diagram illustrating impedance characteristics of the acoustic wave devices of Example 1 and Comparative Example 1.

In FIG. 5, a solid line indicates impedance characteristics of Example 1, and a broken line indicates impedance characteristics of Comparative Example 1. Within a circle indicated by an arrow A in FIG. 5, in Comparative Example 1, a large response due to the higher-order mode appears near 2.4 GHz. Meanwhile, according to Example 1, it was confirmed that the response in the higher-order mode is effectively suppressed.

Figure 3:
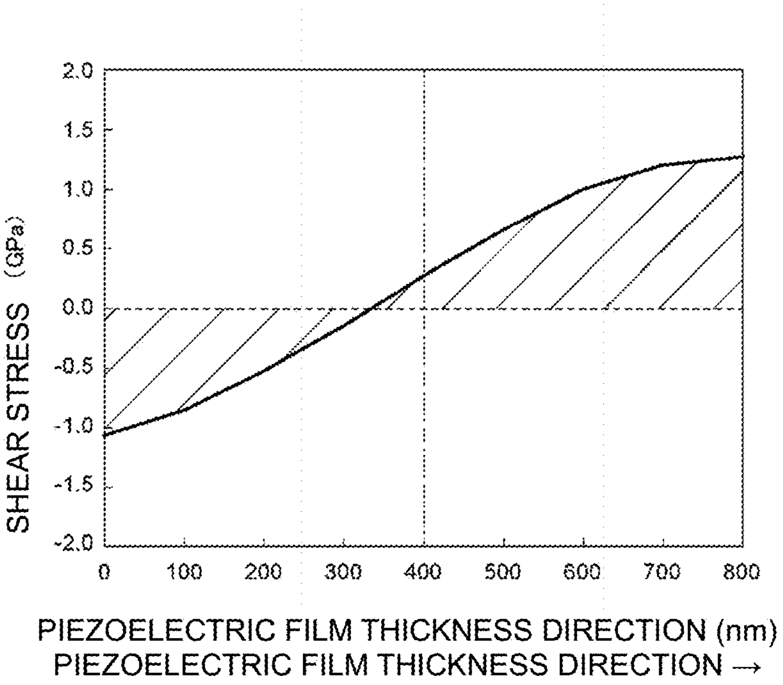
FIG. 3 is a diagram illustrating a relationship between a distance from a start point and a shear stress along a film thickness direction in a piezoelectric film in an acoustic wave device of Comparative Example 1.

The reason why the SH1 mode, which is a higher-order mode, can be suppressed in Example 1 as compared with Comparative Example 1 as described above is considered to be as follows. The first dielectric film 7 and the second dielectric film 8 are made of the same material, but have different film thicknesses at the portion that is in contact with the piezoelectric film 3. Meanwhile, the electrode films in contact with the piezoelectric film 3 are the first IDT electrode 4 and the second IDT electrode 5, and in Comparative Example 1, the mass loads of both are the same. Therefore, stresses are not equal to each other in the first main surface 3*a* and the second main surface 3*b* of the piezoelectric film 3. Therefore, as illustrated in FIG. 3, in Comparative Example 1, an asymmetric stress distribution is generated in the film thickness direction of the piezoelectric film 3. In this case, the shear stress is asymmetric with respect to the center of the piezoelectric film 3 in the film thickness direction of the piezoelectric film 3. That is, the symmetry of the stress distribution in the film thickness direction is broken. Therefore, since the coupling coefficient is determined by a product of an electric field and the stress, the coupling coefficient cannot be reduced.

Figure 4:
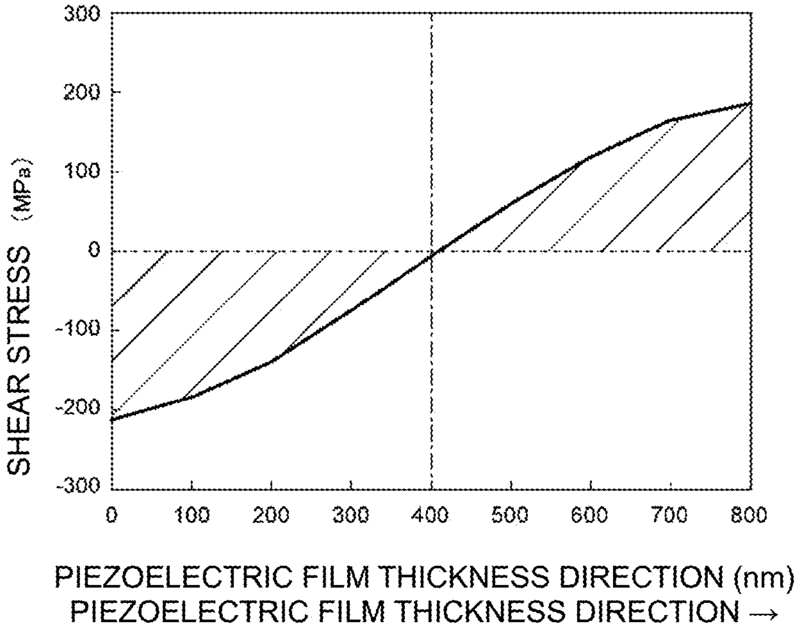
FIG. 4 is a diagram illustrating a relationship between a distance from a start point and a shear stress along a film thickness direction of a piezoelectric film in an acoustic wave device of Example 1.

Meanwhile, as illustrated in FIG. 4, in Example 1, the distribution of the shear stress is symmetrical in the film thickness direction of the piezoelectric film 3. That is, Example 1 has good symmetry. As a result, the coupling coefficient can be reduced.

As described above, by making the magnitude relationship of the mass load by the first dielectric film 7 and the second dielectric film 8 the same in accordance with the magnitude relationship of the mass load by the first IDT electrode 4 and the second IDT electrode 5, the higher-order mode can be effectively suppressed.

In the present preferred embodiment, the first dielectric film 7 and the second dielectric film 8 are provided, but, for example, the first dielectric film does not have to be provided.

Figure 6:
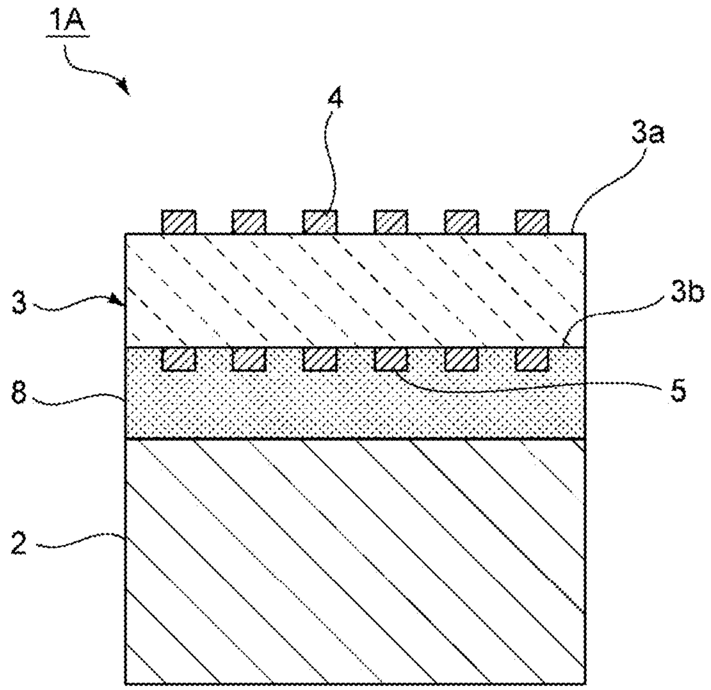
FIG. 6 is a front sectional view for explaining a modification example of the first preferred embodiment of the present invention.

FIG. 6 illustrates an acoustic wave device according to a modification example of the first preferred embodiment. The first dielectric film 7 is not provided in an acoustic wave device 1A. In other respects, the acoustic wave device 1A is the same as the acoustic wave device 1. In a preferred embodiment of the present invention, the first dielectric film does not have to be laminated on the first main surface 3*a* of the piezoelectric film 3. In that case, since there is no mass load of the dielectric film on the first IDT electrode 4, the side where the mass load due to the dielectric film is large is the second IDT electrode 5. Therefore, the total sum of the products of the densities and the film thicknesses of the electrode fingers of the first IDT electrode 4 not covered with the first dielectric film may be smaller than the total sum of the densities and the film thicknesses of the electrode fingers of the second IDT electrode 5.

Conversely, the second dielectric film 8 may be omitted. In that case, the total sum of the products of the densities and the film thicknesses of the electrode fingers of the second IDT electrode 5 may be smaller than the total sum of the products of the densities and the film thicknesses of the electrode fingers of the first IDT electrode 4.

Figure 7:
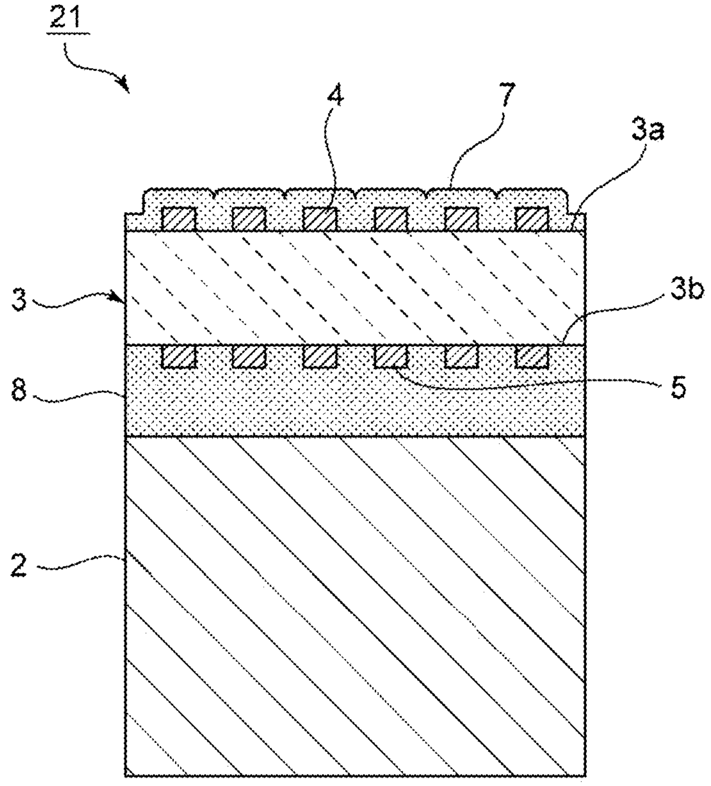
FIG. 7 is a front sectional view of an acoustic wave device according to a second preferred embodiment of the present invention.

FIG. 7 is a front sectional view of an acoustic wave device according to a second preferred embodiment of the present invention.

An acoustic wave device 21 is structurally the same as the acoustic wave device 1 of the first preferred embodiment. Therefore, by attaching the same reference numbers, the description thereof will be omitted by being incorporated.

In the acoustic wave device 21 of the second preferred embodiment, the total sum of products of the densities and the film thicknesses of the electrode fingers of the first IDT electrode 4 covered with a first dielectric film 7 having a smaller product of the density and the film thickness, in the first dielectric film 7 and the second dielectric film 8 is larger than the total sum of the products of the densities and the film thicknesses of the electrode fingers of the second IDT electrode 5, and thus, the occurrence of the higher-order mode is suppressed. This will be described by taking the following specific structure as an example.

As Example 2, the following acoustic wave device was prepared.

Electrode finger pitch of first and second IDT electrodes 4 and 5=1 μm, duty=0.5, λ=2 μm First dielectric film 7: film thickness is 0.04λ

First IDT electrode 4: Cu film, film thickness is 0.06λ

Piezoelectric film 3: 50° Y-cut X-axis propagation $LiTaO_3$ film, film thickness is 0.45λ

Second dielectric film 8: film thickness is 0.3λ

Second IDT electrode 5: Cu film, the film thickness thereof was changed.

Support substrate 2: silicon

In Example 2, the Young's modulus of each of the first dielectric film 7 or the second dielectric film 8 is the same as or four times that of $SiO_2$. As the Young's moduli of the first and second dielectric films 7 and 8 increase, the bulk wave acoustic velocity increases. The influence of the mass loads on the first and second IDT electrodes 4 and 5 was obtained in a case of the dielectric film having a low acoustic velocity of the bulk wave with respect to the acoustic velocity of the acoustic wave propagating through the piezoelectric film 3 and the dielectric film having a high acoustic velocity. In Example 3 and a specific example of a fourth preferred embodiment, which will be described later, the Young's modulus is changed to adjust the acoustic velocity.

The relationship between the mass loads by the first and second dielectric films 7 and 8 is the first dielectric film 7<the second dielectric film 8. In other words, the product of the density and the film thickness of the first dielectric film 7 is set to be smaller than the product of the density and the film thickness of the second dielectric film 8.

Figure 8:
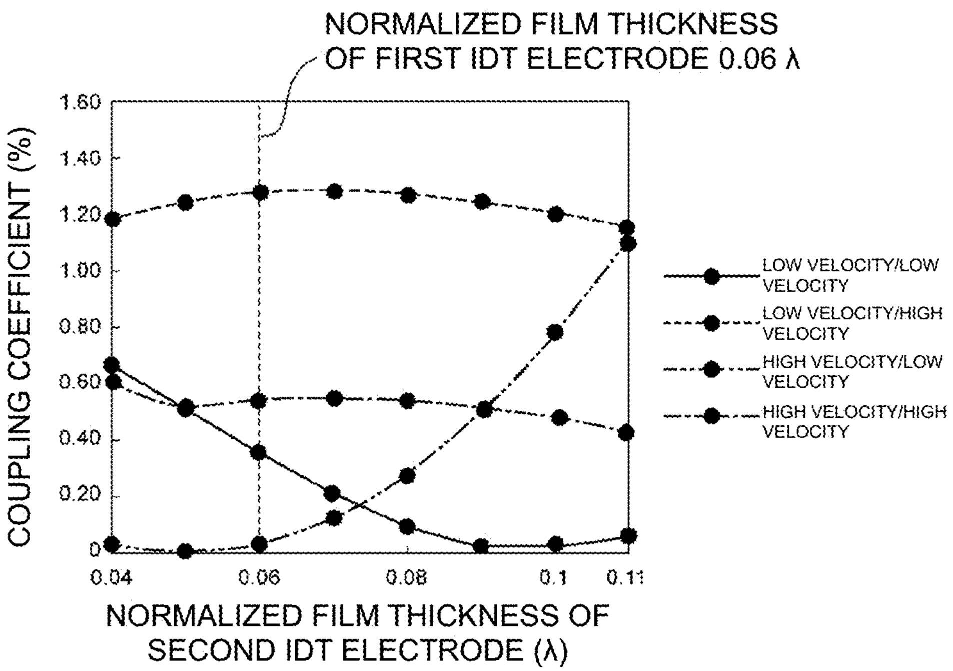
FIG. 8 is a diagram illustrating a relationship between an acoustic velocity relationship of the first and second dielectric films, a normalized film thickness of a second IDT electrode, and a coupling coefficient of a higher-order mode.

FIG. 8 is a diagram illustrating a relationship of the acoustic velocity relationship of the first and second dielectric films 7 and 8, the normalized film thickness of the second IDT electrode 5, and the coupling coefficient of the higher-order mode in Example 2. The acoustic velocity relationship described next to the graph in FIG. 8 indicates the relationship between the acoustic velocity of the first dielectric film 7 and the acoustic velocity of the second dielectric film 8. For example, the low velocity/the low velocity indicates that when the first dielectric film 7 is a low-velocity dielectric film and the Young's modulus thereof is the same as that of $SiO_2$, the second dielectric film 8 is also a low-velocity dielectric film, that is, the Young's modulus thereof is the same as that of $SiO_2$. Here, the low velocity indicates that the acoustic velocity of the propagating bulk wave is lower than the acoustic velocity of the acoustic wave, and the high velocity indicates a case where the acoustic velocity of the propagating bulk wave is higher than the acoustic velocity of the acoustic wave. The high velocity is when the Young's modulus is four times that of $SiO_2$.

As is apparent from FIG. 8, except a case where the second dielectric film 8 is the low-velocity dielectric film and the first dielectric film 7 is the high-velocity dielectric film, when the magnitude relationship between the mass load by the first dielectric film 7 and the mass load by the second dielectric film 8 is set to be the same relationship as the magnitude relationship of the mass load by the first and second IDT electrodes 4 and 5, the higher-order mode is effectively can be suppressed. Therefore, the first and second dielectric films may (a) have the bulk wave acoustic velocity lower than the acoustic velocity of the acoustic wave propagating through the piezoelectric film or (b) have the bulk wave acoustic velocity higher than the acoustic velocity of the acoustic wave propagating through the piezoelectric film, or (c) the first dielectric film may have the bulk wave acoustic velocity lower than the acoustic velocity of the acoustic wave propagating through the piezoelectric film and the second dielectric film has a bulk wave acoustic velocity higher than the acoustic velocity of the acoustic wave propagating through the piezoelectric film.

However, when the second dielectric film 8 is a high acoustic velocity film, the effect of reducing the coupling coefficient of the higher-order mode is low. Therefore, it is preferable that the second dielectric film 8 is a low acoustic velocity film.

Furthermore, it is most preferable that both the first and second dielectric films 7 and 8 are low acoustic velocity films. In that case, when the normalized film thickness of the second IDT electrode 5 is larger than about 0.06λ, it was confirmed that the coupling coefficient of the higher-order mode can be extremely reduced to about 0.37% or less, for example.

This is because when the second dielectric film 8 is a high acoustic velocity film, the second dielectric film 8 functions as an energy confinement structure by being bonded to the silicon substrate which is a high acoustic velocity member.

Figure 9:
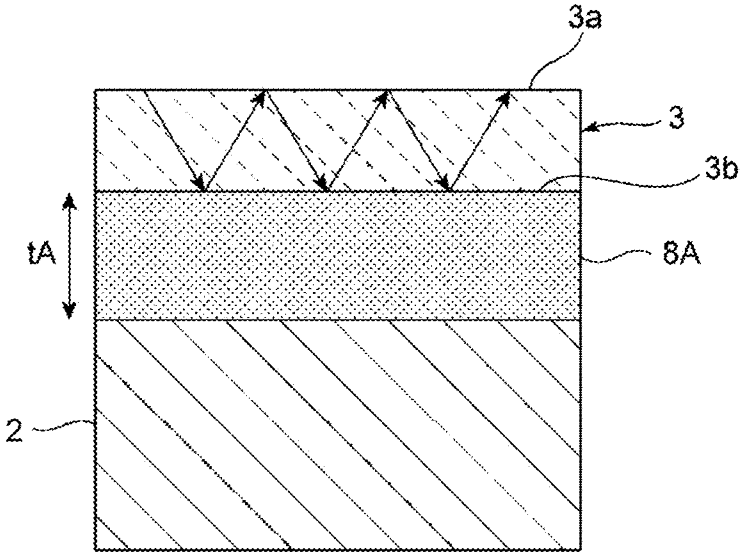
FIG. 9 is a schematic front sectional view for explaining that, in a structure in which a high acoustic velocity film and a piezoelectric film are laminated on a support substrate, when a thickness of the high acoustic velocity film is thick, the high acoustic velocity film functions as an energy confinement layer.

As illustrated in FIG. 9, when the second dielectric film 8A has a film thickness to and is thick, the piezoelectric film 3 is in contact with the energy confinement structure. A displacement of the acoustic wave behaves as an evanescent wave at a boundary surface between the piezoelectric film 3 and the second dielectric film 8A which is a high acoustic velocity film (see FIG. 9). Meanwhile, on the opposite boundary surface of the piezoelectric film 3, that is, on the first main surface 3*a*, the displacement of the piezoelectric film 3 behaves as a propagating wave. Therefore, the symmetry of the shear stress in the piezoelectric film 3 described above is impaired. Therefore, the coupling coefficient of the higher-order mode cannot be reduced.

Figure 10:
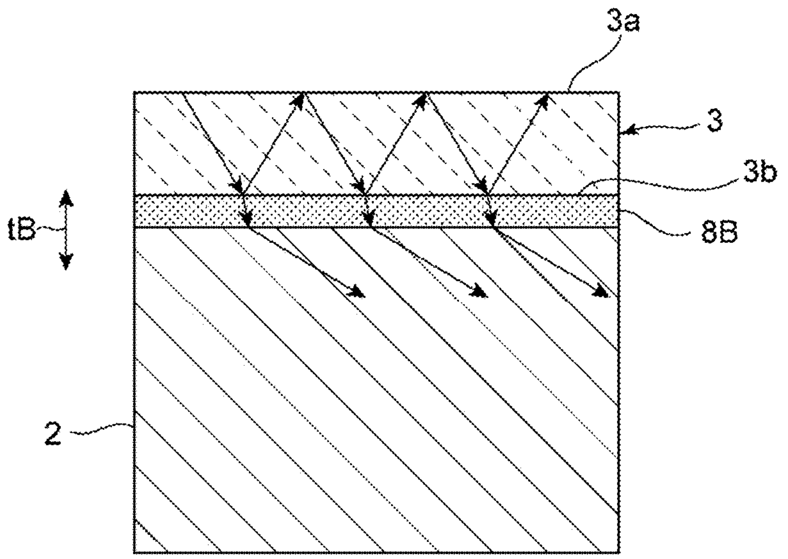
FIG. 10 is a schematic front sectional view for explaining that, in the structure in which a high acoustic velocity film and a piezoelectric film are laminated on the support substrate, when the high acoustic velocity film is thin, the high acoustic velocity film does not function as the energy confinement layer.

In contrast, as illustrated in FIG. 10, when the second dielectric film 8B which is a high acoustic velocity film having a thin film thickness tB is provided to be in contact with the second main surface 3*b* of the piezoelectric film 3, the energy confinement structure is not obtained. That is, as illustrated by the arrows in FIG. 10, a higher-order mode leaks, whereby the symmetry of the acoustic wave distribution in the film thickness direction of the piezoelectric film 3 can be improved, which is preferable. It is preferable that the film thickness of the second dielectric film 8B, which is a high acoustic velocity film, is set to 1λ or less. The film thickness of the high acoustic velocity film that can be an energy confinement structure is determined by the relationship between the acoustic velocity of the acoustic wave propagating through the piezoelectric body and the acoustic velocity of the transversal wave bulk wave of the high acoustic velocity film. This is published, for example, in Japanese Patent No. 5835480, and the content described in Japanese Patent No. 5835480 is cited and incorporated into the present specification.

Figure 11:
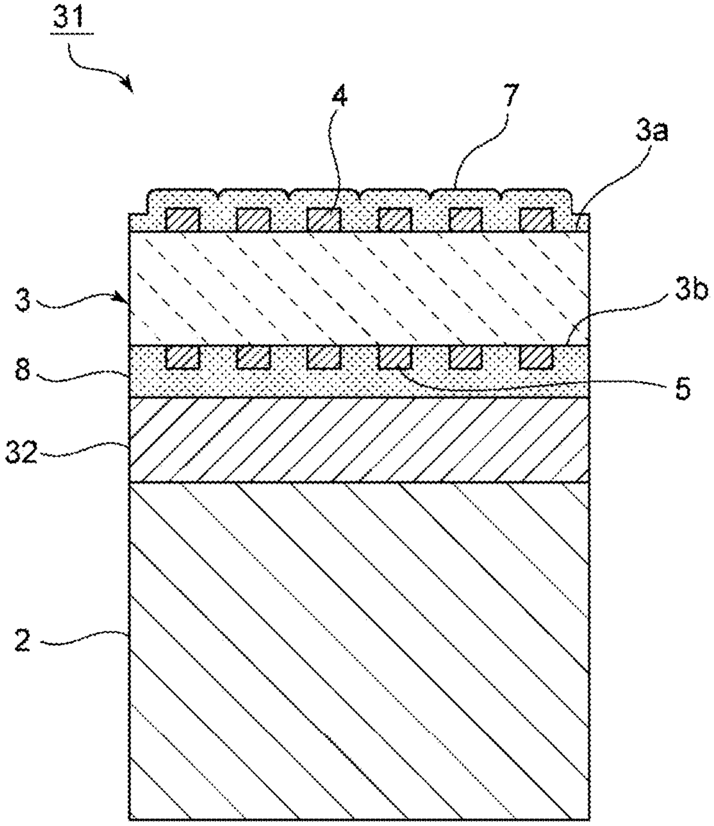
FIG. 11 is a front sectional view of an acoustic wave device according to a third preferred embodiment of the present invention.

FIG. 11 is a front sectional view of an acoustic wave device according to a third preferred embodiment of the present invention. An acoustic wave device 31 is structurally the same as the acoustic wave device 1 of the first preferred embodiment, except for including a third dielectric film 32. Therefore, the same elements and portions are denoted by the same reference numbers, and the description thereof is omitted.

The third dielectric film 32 is laminated between the support substrate 2 and the second dielectric film 8. As described above, in a preferred embodiment of the present invention, the third dielectric film 32 may be further laminated in addition to the second dielectric film 8 on the second main surface 3*b* side of the piezoelectric film 3. In this case, on the side where the second IDT electrode 5 is provided, that is, on the second main surface 3*b* side of the piezoelectric film 3, it may be considered that the mass load by the dielectric film is equal to the sum of the mass load by the second dielectric film 8 and the mass load by the third dielectric film 32. This will be clarified by describing an acoustic wave device of Example 3 below.

Electrode finger pitch of first and second IDT electrodes 4 and 5=1 μm, duty=0.5, λ=2 μm First dielectric film 7: SiN film, film thickness is 0.1λ

First IDT electrode 4: Al film, film thickness is 0.08λ

Piezoelectric film 3: 42° Y-cut X-axis propagation $LiTaO_3$ film, film thickness is 0.4λ

Second dielectric film 8: $SiO_2$ film, film thickness is 0.15λ

Third dielectric film 32: film thickness is 0.2λ

Second IDT electrode 5: Pt film, film thickness changed. Film thickness when mass load is the same as mass load by first IDT electrode 4 is 0.01λ.

Support substrate 2: SiC substrate

Figure 12:
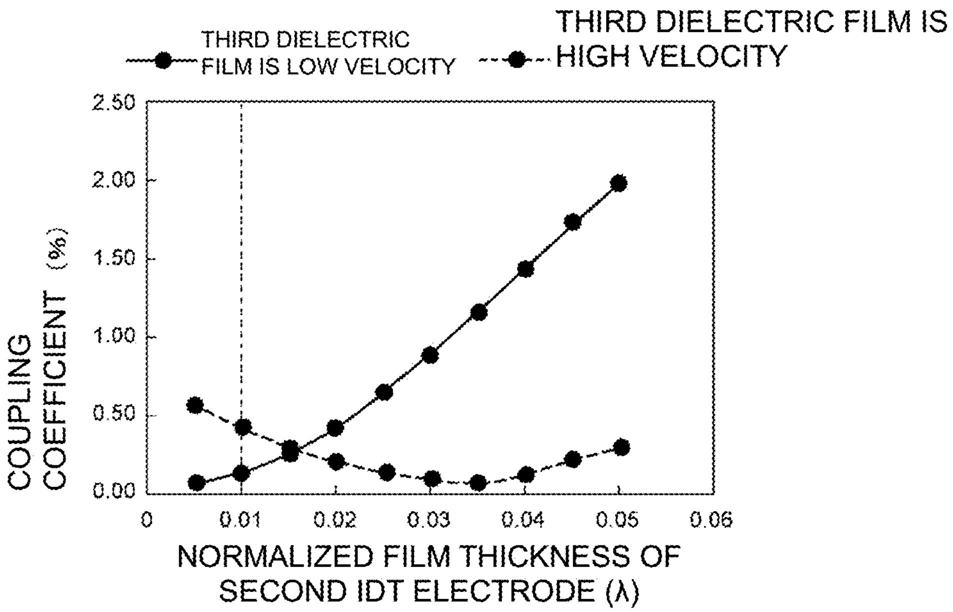
FIG. 12 is a diagram illustrating a relationship between a normalized film thickness of a second IDT electrode and a coupling coefficient of an SH1 mode which is a higher-order mode when an acoustic velocity of a third dielectric film is low and high in the third preferred embodiment of the present invention.

FIG. 12 is a diagram illustrating a relationship between the normalized film thickness of the second IDT electrode and the coupling coefficient of a higher-order mode when the third dielectric film 32 is a low acoustic velocity film and a high acoustic velocity film.

In the present preferred embodiment, the first dielectric film 7 is a high acoustic velocity film, and the second dielectric film 8 is a low acoustic velocity film. Therefore, the magnitude relationship between the mass load by the first IDT electrode 4 and the mass load by the second IDT electrode 5 may be opposite to the magnitude relationship in the mass load between the first and second dielectric films 7 and 8. Further, when the third dielectric film 32 is a high acoustic velocity film, as described above, the third dielectric film 32 is regarded as a part of the energy confinement structure. Therefore, the second dielectric film 8 may be considered as a mass load film for the piezoelectric film 3. Therefore, since the mass load by the first dielectric film 7 is relatively large, it is preferable that the mass load by the second IDT electrode 5 is relatively large.

Therefore, as illustrated in FIG. 12, when the third dielectric film 32 is a high acoustic velocity film, the normalized film thickness of the second IDT electrode 5 may be larger than about 0.01λ.

Meanwhile, when the third dielectric film 32 is a low acoustic velocity film, Q of the acoustic wave by the third dielectric film 32 cannot be ignored. That is, the third dielectric film 32 does not function as an energy confinement structure. Therefore, the mass load by the dielectric film on the second main surface 3*b* of the piezoelectric film 3 is the sum of the mass load by the second dielectric film 8 and the mass load by the third dielectric film 32. In this case, the mass load by the first IDT electrode 4 may be larger than the mass load by the second IDT electrode 5.

Therefore, as is apparent from FIG. 12, when the third dielectric film 32 is a low acoustic velocity film, the normalized film thickness of the second IDT electrode 5 may be thinner than about 0.01λ, which is the thickness when the mass load is the same as that of the first IDT electrode 4, for example.

Figure 13:
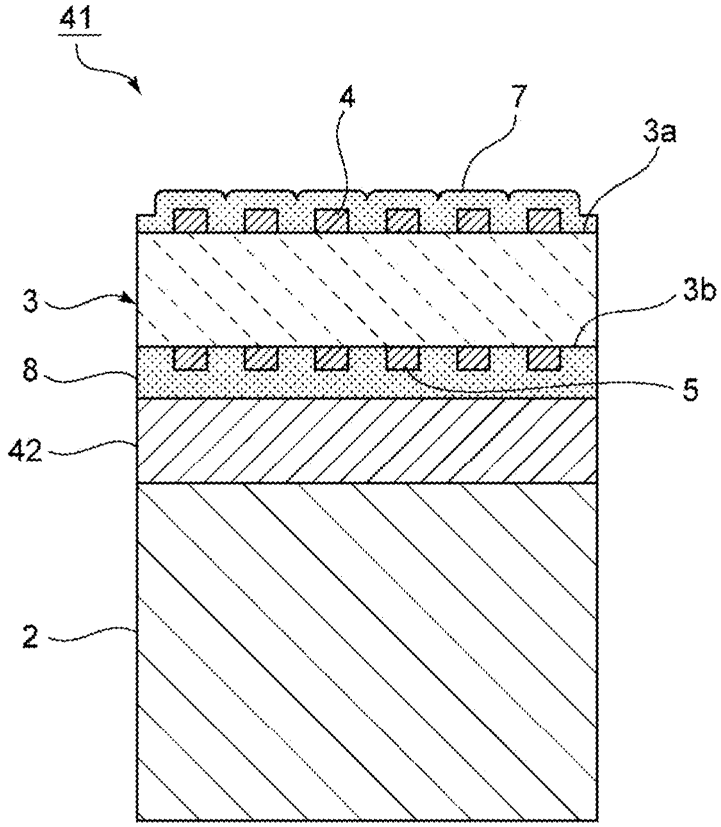
FIG. 13 is a front sectional view of an acoustic wave device according to a fourth preferred embodiment of the present invention.

FIG. 13 is a front sectional view of an acoustic wave device according to a fourth preferred embodiment of the present invention. An acoustic wave device 41 has a third dielectric film 42. Further, the acoustic wave device 41 is structurally the same as the acoustic wave device 31. The result illustrated in the description of the fourth preferred embodiment is a result when the third dielectric film 42 does not function as an energy confinement layer. The following acoustic wave device was prepared.

Electrode finger pitch of first and second IDT electrodes 4 and =1 μm, duty=0.5, λ=2 λm First dielectric film 7: film thickness is 0.05λ

First IDT electrode 4: Al film/Ti film, the film thickness is 0.08λ for the Al film and 0.01λ for the Ti film. The Ti film is located on the first main surface 3*a* side of the piezoelectric film 3.

Piezoelectric film 3: 30° Y-cut X-axis propagation $LiNbO_3$ film, film thickness is 0.3λ

Second dielectric film 8: film thickness is 0.15λ

Third dielectric film 42: $SiO_2$ film, film thickness is 0.2λ

Second IDT electrode 5: Mo film, film thickness changed. The same mass load as the mass load by the first IDT electrode 4 is assumed to be when the film thickness is 0.025λ.

Support substrate 2: diamond

Figure 14:
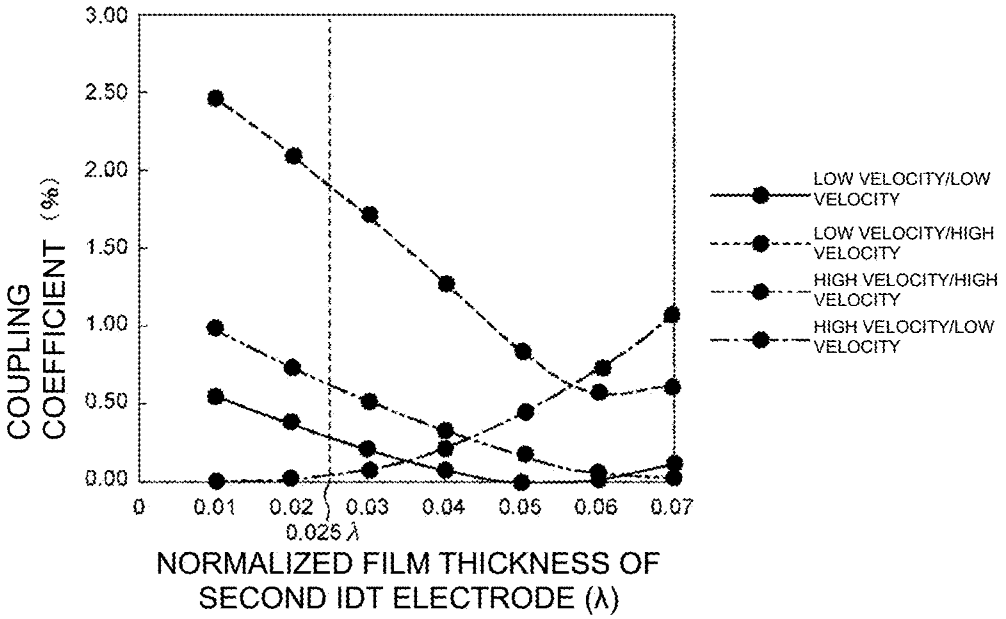
FIG. 14 is a diagram illustrating, in the fourth preferred embodiment of the present invention, in a structure in which a high acoustic velocity film that is not the energy confinement layer is provided on a second main surface of the piezoelectric film, a relationship of an acoustic velocity between a first dielectric film and a second dielectric film, a normalized film thickness of a second IDT electrode, and a coupling coefficient of an SH1 mode which is a higher-order mode.

FIG. 14 is a diagram illustrating a relationship between the acoustic velocity relationship of the first dielectric film 7 and the second dielectric film 8, the normalized film thickness of the second IDT electrode 5, and the coupling coefficient of the SH1 mode which is a higher-order mode. The acoustic velocity relationship in FIG. 14 is the acoustic velocity of the first dielectric film 7/the acoustic velocity of the second dielectric film 8. For example, low velocity/low velocity indicates that the first dielectric film 7 is a low acoustic velocity film and the second dielectric film 8 is also a low acoustic velocity film. The third dielectric film 42 is a low acoustic velocity film made of $SiO_2$ having a film thickness of about 0.2λ, for example. Here, similarly to Example 2, the Young's moduli of the first dielectric film 7 and the second dielectric film 8 are changed so that the relationship between the acoustic velocity of the first dielectric film 7/the acoustic velocity of the second dielectric film 8 is changed.

The third dielectric film 42 is a low acoustic velocity film. The first dielectric film 7 and the second dielectric film 8 are sufficiently thin. Therefore, the second dielectric film 8 does not become an energy confinement layer by itself. Therefore, the mass load film on the second main surface 3*b* side of the piezoelectric film 3 is the sum of the mass loads by the second dielectric film 8 and the third dielectric film 42.

As is apparent from FIG. 14, similarly to the case of Example 2, even in a case the second dielectric film 8 is a high acoustic velocity film, when the acoustic velocity of the first dielectric film 7/the acoustic velocity of the second dielectric film 8 is low/low, low/high, and high/high, it can be seen that the normalized film thickness of the second IDT electrode 5 may be set to be larger than the mass load by the first IDT electrode 4. As a result, the coupling coefficient of the higher-order mode can be reduced.

When the acoustic velocity relationship between the first and second dielectric films 7 and 8 is high/low, in particular, the mass load by the second IDT electrode 5 may be relatively reduced. That is, the normalized film thickness of the second IDT electrode 5 may be set to be thinner than about 0.025λ, for example.

Further, in this case, it was confirmed that the second dielectric film 8 in contact with the piezoelectric film 3 is preferably a low acoustic velocity film in order to more effectively suppress the higher-order mode. When the second dielectric film 8 in contact with the piezoelectric film 3 is a high acoustic velocity film, it is preferable that the energy confinement layer is not configured as described above.

Figure 15:
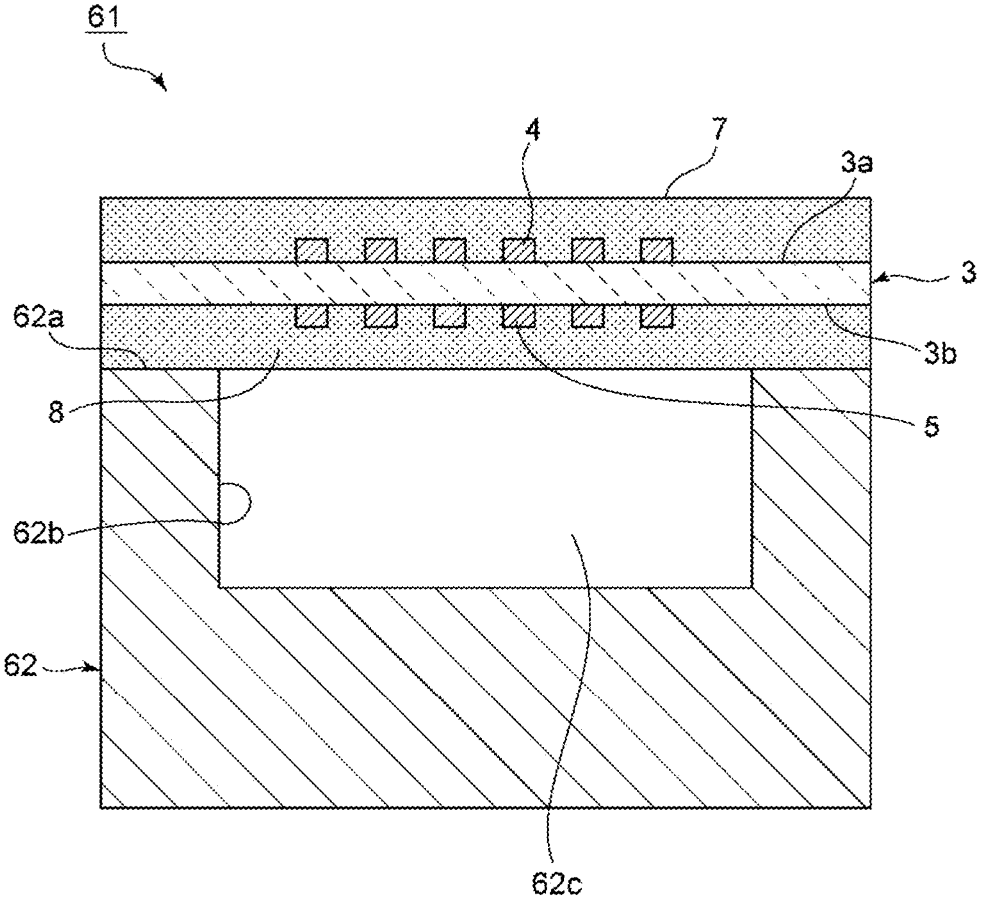
FIG. 15 is a front sectional view of an acoustic wave device according to a fifth preferred embodiment of the present invention.

FIG. 15 is a front sectional view of an acoustic wave device according to a fifth preferred embodiment of the present invention. In an acoustic wave device 61, a support substrate 62 includes a recessed portion 62*b* open in an upper surface 62*a*. A multilayer body of the piezoelectric film 3 and the first and second dielectric films 7 and 8 is laminated to cover the recessed portion 62*b*. As a result, a cavity 62*c* is provided. As described above, the acoustic wave device of the present invention may have a structure in which the piezoelectric film 3 is provided above the cavity 62*c*. Similarly to the first to fourth preferred embodiments, in the acoustic wave device 61, the magnitudes of the mass loads by the first and second IDT electrodes 4 and 5 may be selected based on the acoustic velocities and the magnitudes of the mass loads on the first and second dielectric films 7 and 8. As a result, the higher-order mode can be suppressed.

Figure 16:
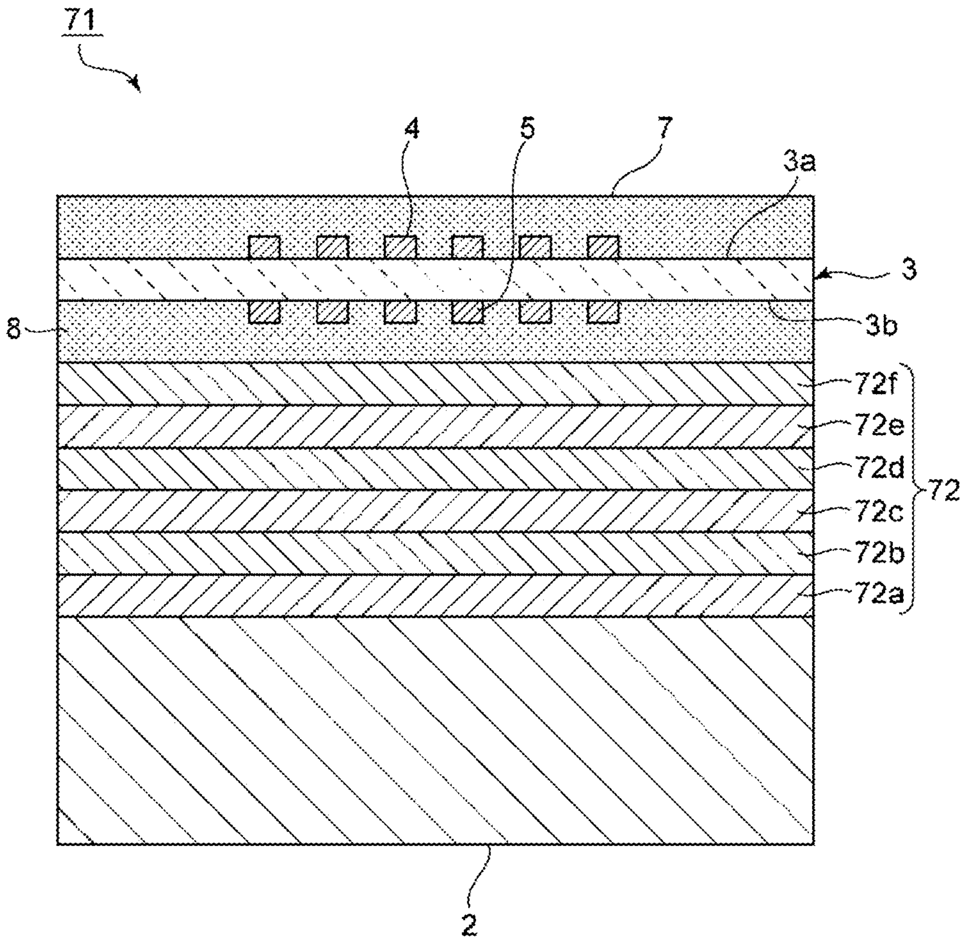
FIG. 16 is a front sectional view of an acoustic wave device according to a sixth preferred embodiment of the present invention.

FIG. 16 is a front sectional view of an acoustic wave device according to a sixth preferred embodiment of the present invention. In an acoustic wave device 71, an acoustic reflecting layer 72 is provided as an energy confinement layer between a support substrate 2 and the second dielectric film 8. As described above, in a preferred embodiment of the present invention, the acoustic reflecting layer 72 may be used as the energy confinement layer. The acoustic reflecting layer 72 includes high acoustic impedance layers 72*a*, 72*c*, and 72*e* having relatively high acoustic impedance, and low acoustic impedance layers 72*b*, 72*d*, and 72*f* having relatively low acoustic impedance. As materials of the high acoustic impedance layers 72*a*, 72*c*, and 72*e* and the low acoustic impedance layers 72*b*, 72*d*, and 72*f*, an appropriate material that satisfies the above-described acoustic impedance relationship can be used.

In addition, in a preferred embodiment of the present invention, the piezoelectric film is configured with $LiTaO_3$ or $LiNbO_3$ as described above, but the material of the piezoelectric film is not limited thereto. That is, in addition to lithium tantalate or lithium niobate, aluminum nitride, zinc oxide, and the like can be used. The thickness of the piezoelectric film is preferably, for example, about 3 times or less of the smaller one of the electrode finger pitches of the first IDT electrode and the second IDT electrode.

As a material of the support substrate, sapphire, silicon, diamond, and various insulators or semiconductors can be used. Further, when the energy confinement structure is laminated, the support substrate may be made of a low acoustic velocity material.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a piezoelectric film that includes a first main surface and a second main surface that face each other;

an interdigital transducer (IDT) electrode in contact with the piezoelectric film and including a first IDT electrode on the first main surface of the piezoelectric film and a second IDT electrode on the second main surface of the piezoelectric film;

an energy confinement layer on a side of the second main surface of the piezoelectric film to confine energy of an acoustic wave propagating through the piezoelectric film in the piezoelectric film; and first and second dielectric films covering the first and second IDT electrodes, respectively, on the first main surface and the second main surface of the piezoelectric film, or the first or second dielectric films covering the first IDT electrode or the second IDT electrode on one of the first main surface and the second main surface, the first and second dielectric films being not provided on the other of the first main surface and the second main surface; wherein the first and second dielectric films have a bulk wave acoustic velocity lower than an acoustic velocity of the acoustic wave propagating through the piezoelectric film or a bulk wave acoustic velocity higher than the acoustic velocity of the acoustic wave propagating through the piezoelectric film, or the first dielectric film has a bulk wave acoustic velocity lower than the acoustic velocity of the acoustic wave propagating through the piezoelectric film and the second dielectric film has a bulk wave acoustic velocity higher than the acoustic velocity of the acoustic wave propagating through the piezoelectric film; and a total sum of a product of a density and a film thickness of an electrode finger of the IDT electrode that is covered with a dielectric film having a smaller product of a density and a film thickness, in the first dielectric film and the second dielectric film or is not covered with any of the first and second dielectric films is smaller than a total sum of a product of a density and a film thickness of an electrode finger of the IDT electrode that is covered with a dielectric film having a larger product of the density and the film thickness, in the first dielectric film and the second dielectric film or is provided on a main surface on a side opposite to the IDT electrode not covered with any of the first and second dielectric films.

2. The acoustic wave device according to claim 1, wherein the energy confinement layer is a high acoustic velocity structure including a high acoustic velocity material having a higher acoustic velocity of the bulk wave than the acoustic velocity of the acoustic wave propagating through the piezoelectric film.

3. The acoustic wave device according to claim 1, wherein the energy confinement layer is an acoustic reflecting layer including a low acoustic impedance layer having a relatively low acoustic impedance and a high acoustic impedance layer having a relatively high acoustic impedance.

4. The acoustic wave device according to claim 1, wherein a film thickness of the piezoelectric film is about 3 times or less of an electrode finger pitch of a smaller one of electrode finger pitches of the first IDT electrode and the second IDT electrode.

5. The acoustic wave device according to claim 1, wherein the piezoelectric film is made of lithium niobate or lithium tantalate.

6. The acoustic wave device according to claim 1, wherein the electrode finger of the first IDT electrode and the electrode finger of the second IDT electrode are in an in-phase relationship.

7. The acoustic wave device according to claim 1, wherein the electrode finger of the first IDT electrode and the electrode finger of the second IDT electrode are in an anti-phase relationship.

8. An acoustic wave device comprising:

a piezoelectric film that includes a first main surface and a second main surface that face each other;

an interdigital transducer (IDT) electrode in contact with the piezoelectric film and including a first IDT electrode on the first main surface of the piezoelectric film and a second IDT electrode on the second main surface of the piezoelectric film;

an energy confinement layer on a side of the second main surface of the piezoelectric film to confine energy of an acoustic wave propagating through the piezoelectric film in the piezoelectric film; and first and second dielectric films covering the first and second IDT electrodes, respectively, on the first main surface and the second main surface of the piezoelectric film, or the first or second dielectric film covering the first IDT electrode or the second IDT electrode on one of the first main surface and the second main surface, the first and second dielectric films being not provided on the other of the first main surface and the second main surface; wherein the first dielectric film has a bulk wave acoustic velocity higher than an acoustic velocity of an acoustic wave propagating through the piezoelectric film and the second dielectric film has a bulk wave acoustic velocity lower than the acoustic velocity of the acoustic wave propagating through the piezoelectric film; and a total sum of a product of a density and a film thickness of an electrode finger of the IDT electrode covered with a dielectric film having a smaller product of a density and a film thickness, in the first dielectric film and the second dielectric film or is not covered with any of the first and second dielectric films is larger than a total sum of a product of a density and a film thickness of an electrode finger of the IDT electrode that is covered with a dielectric film having a larger product of the density and the film thickness, in the first dielectric film and the second dielectric film or is provided on a main surface on a side opposite to the IDT electrode not covered with any of the first and second dielectric films.

9. The acoustic wave device according to claim 8, wherein the energy confinement layer is a high acoustic velocity structure including a high acoustic velocity material having a higher acoustic velocity of the bulk wave than the acoustic velocity of the acoustic wave propagating through the piezoelectric film.

10. The acoustic wave device according to claim 8, wherein the energy confinement layer is an acoustic reflecting layer including a low acoustic impedance layer having a relatively low acoustic impedance and a high acoustic impedance layer having a relatively high acoustic impedance.

11. The acoustic wave device according to claim 8, wherein a film thickness of the piezoelectric film is about 3 times or less of an electrode finger pitch of the smaller one in electrode finger pitches of the first IDT electrode and the second IDT electrode.

12. The acoustic wave device according to claim 8, wherein the piezoelectric film is made of lithium niobate or lithium tantalate.

13. The acoustic wave device according to claim 8, wherein the electrode finger of the first IDT electrode and the electrode finger of the second IDT electrode are in an in-phase relationship.

14. The acoustic wave device according to claim 8, wherein the electrode finger of the first IDT electrode and the electrode finger of the second IDT electrode are in an anti-phase relationship.

15. An acoustic wave device comprising:

a piezoelectric film including a first main surface and a second main surface that face each other;

an interdigital transducer (IDT) electrode in contact with the piezoelectric film and including a first IDT electrode on the first main surface of the piezoelectric film and a second IDT electrode on the second main surface of the piezoelectric film;

a support substrate on a side of the second main surface of the piezoelectric film and including a cavity; and first and second dielectric films covering the first and second IDT electrodes, respectively, on the first main surface and the second main surface of the piezoelectric film, or the first or second dielectric film covering the first IDT electrode or the second IDT electrode on one of the first main surface and the second main surface, the first and second dielectric films being not provided on the other of the first main surface and the second main surface; wherein the first and second dielectric films have a bulk wave acoustic velocity lower than an acoustic velocity of an acoustic wave propagating through the piezoelectric film or have a bulk wave acoustic velocity higher than the acoustic velocity of the acoustic wave propagating through the piezoelectric film, or the first dielectric film has the bulk wave acoustic velocity lower than the acoustic velocity of the acoustic wave propagating through the piezoelectric film and the second dielectric film has a bulk wave acoustic velocity higher than the acoustic velocity of the acoustic wave propagating through the piezoelectric film; and a total sum of a product of a density and a film thickness of an electrode finger of the IDT electrode that is covered with a dielectric film having a smaller product of a density and a film thickness, in the first dielectric film and the second dielectric film or is not covered with any of the first and second dielectric films is smaller than a total sum of a product of a density and a film thickness of an electrode finger of the IDT electrode that is covered with a dielectric film having a larger product of the density and the film thickness, in the first dielectric film and the second dielectric film or is provided on a main surface on a side opposite to the IDT electrode not covered with any of the first and second dielectric films.

16. The acoustic wave device according to claim 15, wherein a film thickness of the piezoelectric film is about 3 times or less of an electrode finger pitch of the smaller one in electrode finger pitches of the first IDT electrode and the second IDT electrode.

17. The acoustic wave device according to claim 15, wherein the piezoelectric film is made of lithium niobate or lithium tantalate.

18. The acoustic wave device according to claim 15, wherein the electrode finger of the first IDT electrode and the electrode finger of the second IDT electrode are in an in-phase relationship.

19. The acoustic wave device according to claim 15, wherein the electrode finger of the first IDT electrode and the electrode finger of the second IDT electrode are in an anti-phase relationship.

20. An acoustic wave device comprising:

a piezoelectric film that includes a first main surface and a second main surface that face each other;

an interdigital transducer (IDT) electrode in contact with the piezoelectric film and including a first IDT electrode on the first main surface of the piezoelectric film and a second IDT electrode on the second main surface of the piezoelectric film;

a support substrate on a side of the second main surface of the piezoelectric film and including a cavity; and first and second dielectric films covering the first and second IDT electrodes, respectively, on the first main surface and the second main surface of the piezoelectric film, or the first or second dielectric film covering the first IDT electrode or the second IDT electrode on one of the first main surface and the second main surface, the first and second dielectric films being not provided on the other of the first main surface and the second main surface; wherein the first dielectric film has a bulk wave acoustic velocity higher than an acoustic velocity of an acoustic wave propagating through the piezoelectric film and the second dielectric film has a bulk wave acoustic velocity lower than the acoustic velocity of the acoustic wave propagating through the piezoelectric film; and a total sum of a product of a density and a film thickness of an electrode finger of the IDT electrode that is covered with a dielectric film having a smaller product of a density and a film thickness, in the first dielectric film and the second dielectric film or is not covered with any of the first and second dielectric films is larger than a total sum of a product of a density and a film thickness of an electrode finger of the IDT electrode that is covered with a dielectric film having a larger product of the density and the film thickness, in the first dielectric film and the second dielectric film or provided on a main surface on a side opposite to the IDT electrode not covered with any of the first and second dielectric films.

21. The acoustic wave device according to claim 20, wherein a film thickness of the piezoelectric film is about 3 times or less of an electrode finger pitch of the smaller one in electrode finger pitches of the first IDT electrode and the second IDT electrode.

22. The acoustic wave device according to claim 20, wherein the piezoelectric film is made of lithium niobate or lithium tantalate.

23. The acoustic wave device according to claim 20, wherein the electrode finger of the first IDT electrode and the electrode finger of the second IDT electrode are in an in-phase relationship.

24. The acoustic wave device according to claim 20, wherein the electrode finger of the first IDT electrode and the electrode finger of the second IDT electrode are in an anti-phase relationship.

* * * * *